(12) United States Patent
Qian et al.

(10) Patent No.: US 12,125,777 B2
(45) Date of Patent: Oct. 22, 2024

(54) MINIMIZING PACKAGE IMPEDANCE DISCONTINUITY THROUGH DIELECTRIC STRUCTURE OPTIMIZATIONS

(71) Applicant: Intel Corporation, Santa Clara, CA (US)

(72) Inventors: Zhiguo Qian, Chandler, AZ (US);
Gang Duan, Chandler, AZ (US);
Kemal Aygün, Tempe, AZ (US);
Jieying Kong, Chandler, AZ (US);
Brandon C. Marin, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 920 days.

(21) Appl. No.: 16/666,202

(22) Filed: Oct. 28, 2019

(65) Prior Publication Data
US 2021/0125912 A1    Apr. 29, 2021

(51) Int. Cl.
*H01L 23/49*     (2006.01)
*H01L 21/48*     (2006.01)
*H01L 23/498*    (2006.01)
*H01L 23/66*     (2006.01)

(52) U.S. Cl.
CPC ...... *H01L 23/49838* (2013.01); *H01L 21/481* (2013.01); *H01L 21/4853* (2013.01); *H01L 23/49816* (2013.01); *H01L 23/49894* (2013.01); *H01L 23/66* (2013.01)

(58) Field of Classification Search
CPC ................................................ H01L 23/49838
USPC ........................................................ 361/760
See application file for complete search history.

(56) References Cited

U.S. PATENT DOCUMENTS

| | | | | |
|---|---|---|---|---|
| 7,945,884 | B1 * | 5/2011 | Goergen | G06F 13/409 716/126 |
| 9,686,855 | B2 * | 6/2017 | Ishikawa | H05K 1/181 |
| 2010/0326716 | A1 * | 12/2010 | Zhang | H05K 1/024 174/262 |
| 2012/0153500 | A1 * | 6/2012 | Kim | H01L 21/76898 438/653 |
| 2014/0209374 | A1 * | 7/2014 | Song | H01L 23/552 174/388 |
| 2016/0066429 | A1 * | 3/2016 | Taniguchi | H05K 1/0281 361/749 |
| 2019/0287953 | A1 * | 9/2019 | Moon | H01L 23/49894 |
| 2020/0098811 | A1 * | 3/2020 | Chen | H01L 27/14618 |
| 2020/0275552 | A1 * | 8/2020 | Wu | H05K 3/4602 |
| 2021/0118830 | A1 * | 4/2021 | Huang | H01L 24/03 |

* cited by examiner

*Primary Examiner* — Stanley Tso
(74) *Attorney, Agent, or Firm* — Schwabe, Williamson & Wyatt P.C.

(57) ABSTRACT

Embodiments disclosed herein include electronic packages and methods of forming such packages. In an embodiment, an electronic package comprises a first buildup layer and a second buildup layer over the first buildup layer. In an embodiment, a void is disposed through the second buildup layer. In an embodiment the electronic package further comprises a first pad over the second buildup layer. In an embodiment, the first pad covers the void.

21 Claims, 13 Drawing Sheets

MINIMIZING PACKAGE IMPEDANCE DISCONTINUITY THROUGH DIELECTRIC STRUCTURE OPTIMIZATIONS

TECHNICAL FIELD

Embodiments of the present disclosure relate to semiconductor devices, and more particularly to interconnect architectures that include dielectric voids around pads.

BACKGROUND

Serializer/Deserializer (SerDes) speed has increased rapidly to meet the fast growing demands of data bandwidth. One bandwidth limiter is the large ball grid array (BGA) or socket landing pads on the package substrate. The large pads are very capacitive, and therefore, drive a dramatic decrease in the impedance. This causes strong signal reflections and consumes a significant portion of the loss budget.

One solution to decrease capacitance of the large pads is to create large metal voids in multiple metal planes above and below the large pads. However, creating large voiding in multiple layers significantly reduces the local metal density, and results in increased manufacturing and reliability risks. Routing requirements also may prevent the ability to implement metal voiding in some layers.

Another solution is to intentionally increase the inductance of the structure adjacent to the pad by using spiral inductor like structures with extra routings. However, the inductor-like interconnect approach significantly congests the back-side layers and makes the package design very complicated.

EMBODIMENTS OF THE PRESENT DISCLOSURE

Described herein are electronic packages with interconnect architectures that include dielectric voids around pads, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, large pads for high speed signaling suffer from high capacitances. For example, ball grid array (BGA) pads for SerDes and PCIe applications generate too much capacitance, which results in reflections and losses in the system. Other interconnects, such as sockets and connectors, also include large pads and suffer similar drawbacks. Accordingly, embodiments disclosed herein include pads that cover a dielectric void in the package substrate.

The majority of the capacitance is derived from the interaction of the pad and the metal layer over the pad. The capacitance is proportional to the size of the overlapping area and the dielectric constant of the material between the two features. In a typical package substrate, the buildup material has a dielectric constant that is approximately 3.0 or greater. Embodiments disclosed herein decrease the capacitance by reducing the dielectric constant. In a particular embodiment, the dielectric constant is reduced by forming a void in the buildup material below the pad. That is, the dielectric constant is reduced to 1.0 (i.e., the dielectric constant for air). In other embodiments, the buildup material is replaced with a dielectric foam. The dielectric foam has a large percentage of air (by volume), and therefore, approaches a dielectric constant of 1.0. Additionally, the use of a foam may provide enhanced structural stability compared to a void. Such embodiments may provide improved reliability and manufacturability. It should be noted that the air also has the added advantage of decreasing the dielectric loss tangent of the foam, since the dielectric loss tangent of air is near zero.

Figure 1A:
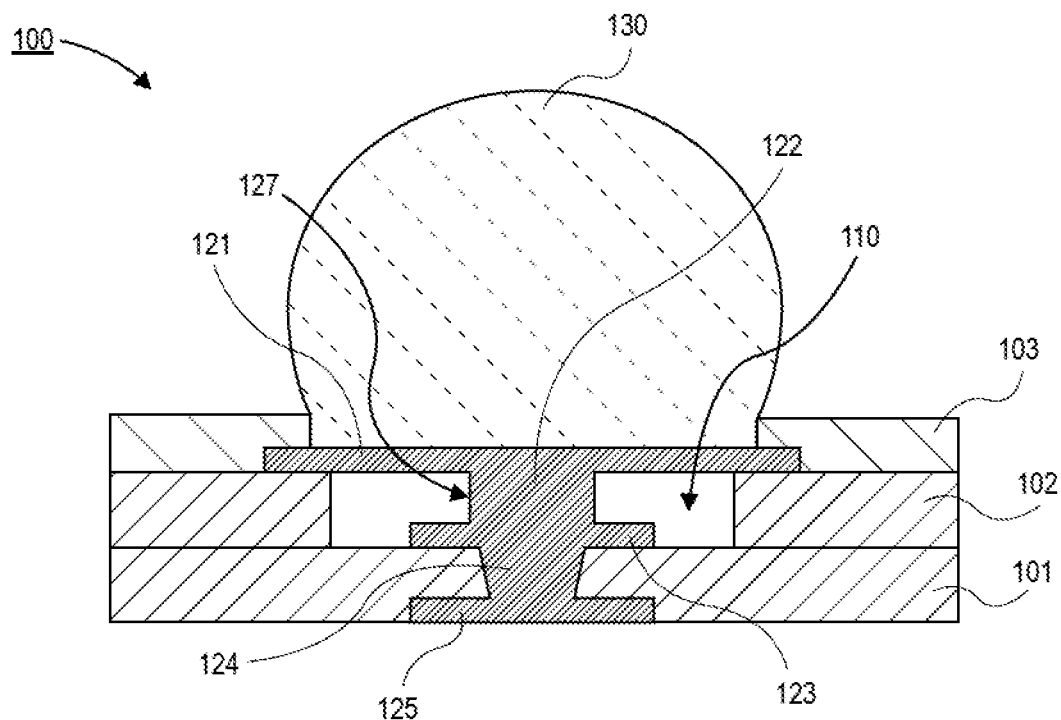
FIG. 1A is a cross-sectional illustration of a portion of an electronic package that includes a pad with an underlying cavity, in accordance with an embodiment.

Referring now to FIG. 1A, a cross-sectional illustration of a portion of an electronic package 100 is shown, in accordance with an embodiment. In the illustrated embodiment, only two buildup layers 101, 102 are shown for simplicity. However, it is to be appreciated that the electronic package 100 may include any number of buildup layers. The buildup layers 101, 102 may be organic buildup layers typical of packaging substrates. In some embodiments, the first buildup layer 101 may be the same material as the second buildup layer 102. However, in other embodiments, the first buildup layer 101 may be a different material than the second buildup layer 102. For example, the second buildup layer 102 may be a photo-imageable dielectric (PID). The use of a PID for the second buildup layer 102 may improve the ease of forming the void 110, as will be described in greater detail below.

In an embodiment, a first pad 121 may be disposed over the second buildup layer 102. The first pad 121 may be a pad for interfacing with an interconnect feature. For example, in FIG. 1A the interconnect feature is shown as a solder ball 130. However, it is to be appreciated that embodiments may also accommodate interconnect architectures such as sockets, connectors, or the like. In an embodiment, an insulating layer 103 may be disposed over the second buildup layer 102 and cover a portion of the first pad 121. For example, the insulating layer 103 may be a solder resist or the like.

In an embodiment, the first pad 121 may span across a void 110 in the second buildup layer 102. The presence of the void 110 below the first pad 121 reduces the dielectric constant to 1 (i.e., the dielectric constant of air). As such, the capacitance of the first pad 121 is reduced. In an embodiment, the void 110 may have a width that is less than the width of the first pad 121. That is, the first pad 121 spans entirely across the void 110 and is supported from below by the second buildup layer 102.

In an embodiment, the first pad 121 may be electrically coupled to a second pad 123 over the first buildup layer 101. For example, a via 122 may pass through a thickness of the void 110 to connect the first pad 121 to the second pad 123. In an embodiment, the via 122 may have a sidewall 127 that has a substantially vertical profile that is characteristic of a lithographic patterning process. In other embodiments, the via 122 may have a sidewall 127 that has a tapered profile (not shown). For example, the sidewall 127 may taper so that an end of the via 122 closest to the first pad 121 is wider than an end of the via 122 closes to the second pad 123. Such a tapered profile may be characteristic of a laser drilled opening. In an embodiment, the second pad 123 may be electrically coupled to a third pad 125 by a second via 124 that passes through the first buildup layer 101.

Figure 1B:
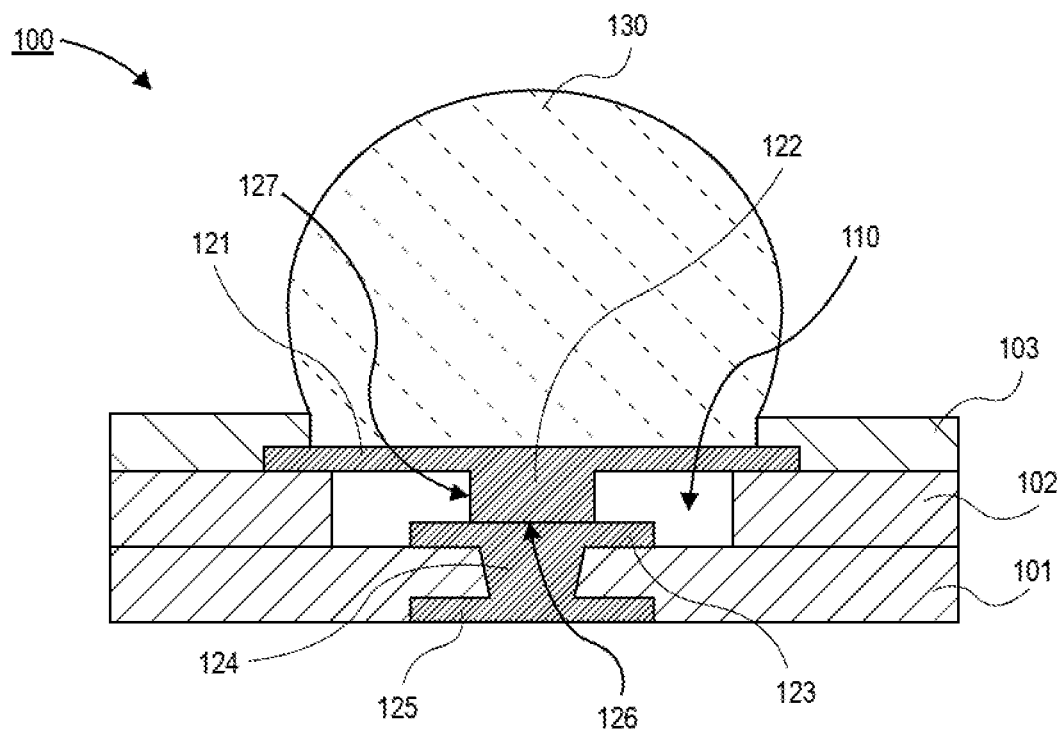
FIG. 1B is a cross-sectional illustration of a portion of an electronic package that includes a pad with an underlying cavity, in accordance with an additional embodiment.

Referring now to FIG. 1B, a cross-sectional illustration of a portion of an electronic package 100 is shown, in accordance with an additional embodiment. In an embodiment, the electronic package 100 in FIG. 1B may be substantially similar to the electronic package 100 in FIG. 1A, with the exception that the via 122 is different. The difference in the vias 122 may be attributable to different manufacturing processes used to form the electronic packages 100. In FIG. 1B, the via 122 has a sidewall 127 that includes a substantially vertical profile. The vertical profile of the sidewall 127 of the via 122 may be characteristic of a lithographically defined opening.

In an embodiment, the electronic package 100 in FIG. 1B may also differ from the electronic package 100 in FIG. 1A with respect to the interface between the via 122 and the second pad 123. In FIG. 1A, the interface may include no discernable boundary between the two components, whereas the interface in FIG. 1B may include a distinguishable seam 126 between the via 122 and the second pad 123. The seam 126 may be characteristic of a fusion bonding process (e.g., copper-to-copper fusion bonding).

Figure 1C:
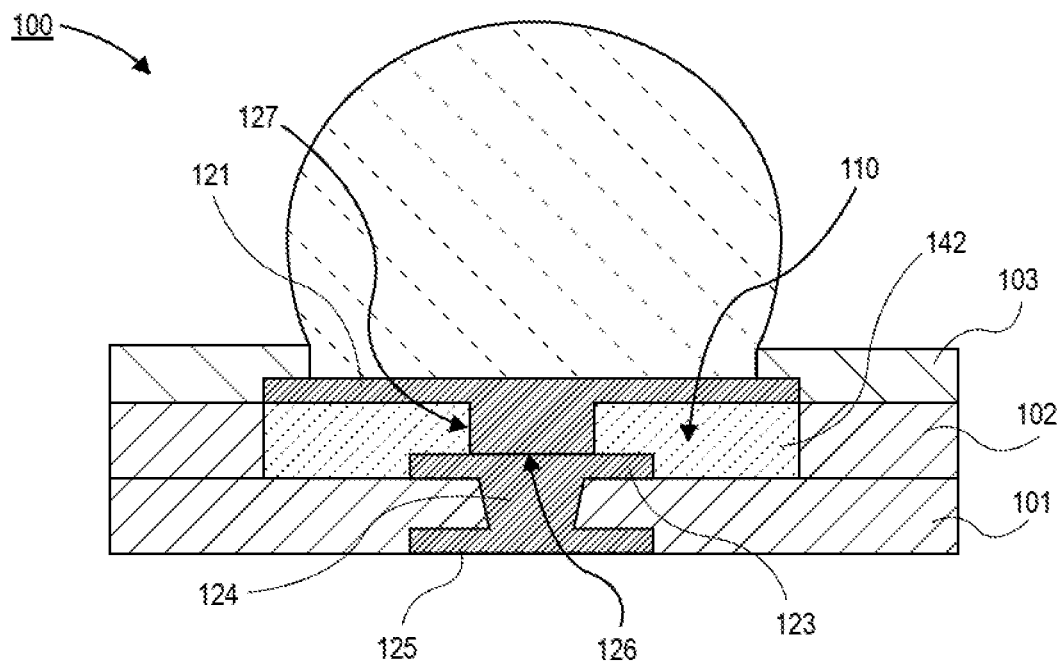
FIG. 1C is a cross-sectional illustration of a portion of an electronic package that includes a pad with underlying cavity that is filled with a dielectric foam, in accordance with an embodiment.

Referring now to FIG. 1C, a cross-sectional illustration of a portion of an electronic package 100 is shown, in accordance with an embodiment. In an embodiment, the electronic package 100 may be similar to the electronic package 100 in FIG. 1B, with the exception that a dielectric foam 142 is disposed in the void 110. In an embodiment, the dielectric foam 142 may be any suitable dielectric material with a relatively high volume percentage of voids (i.e., air-gaps). For example, the dielectric foam 142 may be a polyurethane foam, polyimide foam, polyethelyne foam, cyclo-olefin polymer (with intrinsic low dielectric constant unrelated to air gaps) or the like. The dielectric constant of the dielectric foam 142 may depend on the volume percentage of air in the foam. As the volume percentage of air increases, the dielectric constant approaches 1 and the dielectric loss tangent decreases. In a particular embodiment, the dielectric constant of the dielectric foam 142 is approximately 2 or less, approximately 1.5 or less, approximately 1.2 or less, or approximately 1.1 or less.

In an embodiment, the first pad 121 is entirely supported by the dielectric foam 142. That is, a width of the void 110 may be larger than a width of the first pad 121. Such a configuration allows for the low dielectric constant material to extend across the entire surface of the first pad 121. This allows for further reductions in the capacitance. In an embodiment, the use of a dielectric foam 142 in the void also improves the mechanical stability and reliability of the electronic package compared to the use of an unfilled void 110 (as shown in FIGS. 1A and 1B).

Figure 2A:
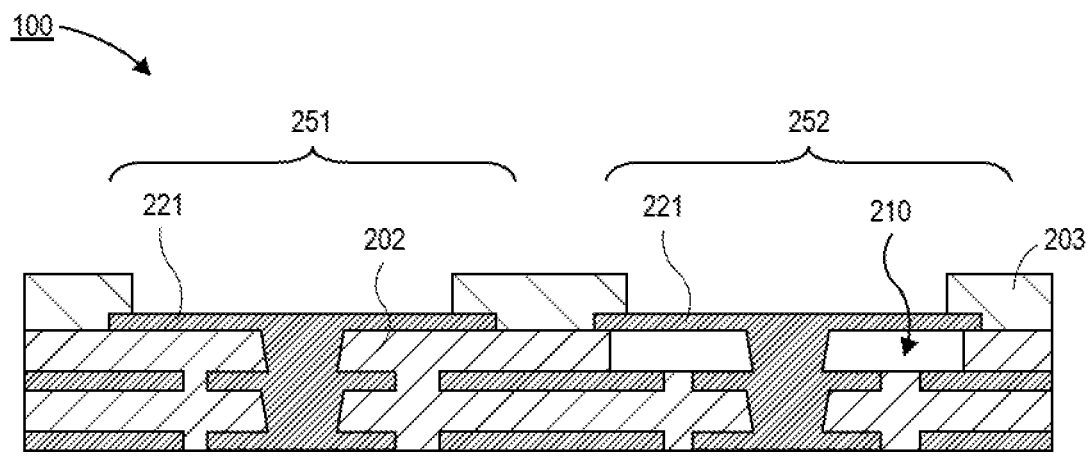
FIG. 2A is a cross-sectional illustration of an electronic package that includes a first pad and a second pad, where the second pad is over a void, in accordance with an embodiment.

Referring now to FIG. 2A, a cross-sectional illustration of a portion of an electronic package 200 is shown, in accordance with an embodiment. In an embodiment, the electronic package 200 comprises first pad structures 251 and second pad structures 252. The first pad structures 251 are different from the second pad structures 252. For example, the first pad structures 251 may be used for relatively low speed signaling applications and the second pad structures 252 may be used for relatively high speed signaling (i.e., a higher speed than what is sent through the first pad structures 251). For example, the second pad structures 252 may be used for SerDes or PCIe signaling.

Due to the different performance metrics needed for the first pad structures 251 and the second pad structures 252, the architectures may be different. For example, the first pad structures 251 may include typical architectures with a first pad 221 that is over a buildup layer 202. The second pad structures 252 may include architectures that include a void 210 below the first pad 221. The void 210 may be substantially similar to those described above in FIGS. 1A-1C. While shown as an empty void, it is to be appreciated that the void 210 may also be filled with a dielectric foam in some embodiments. In an embodiment, an insulating layer 203 may cover portions of the first pads 221 of both the first pad structures 251 and the second pad structures 252.

Figure 2B:
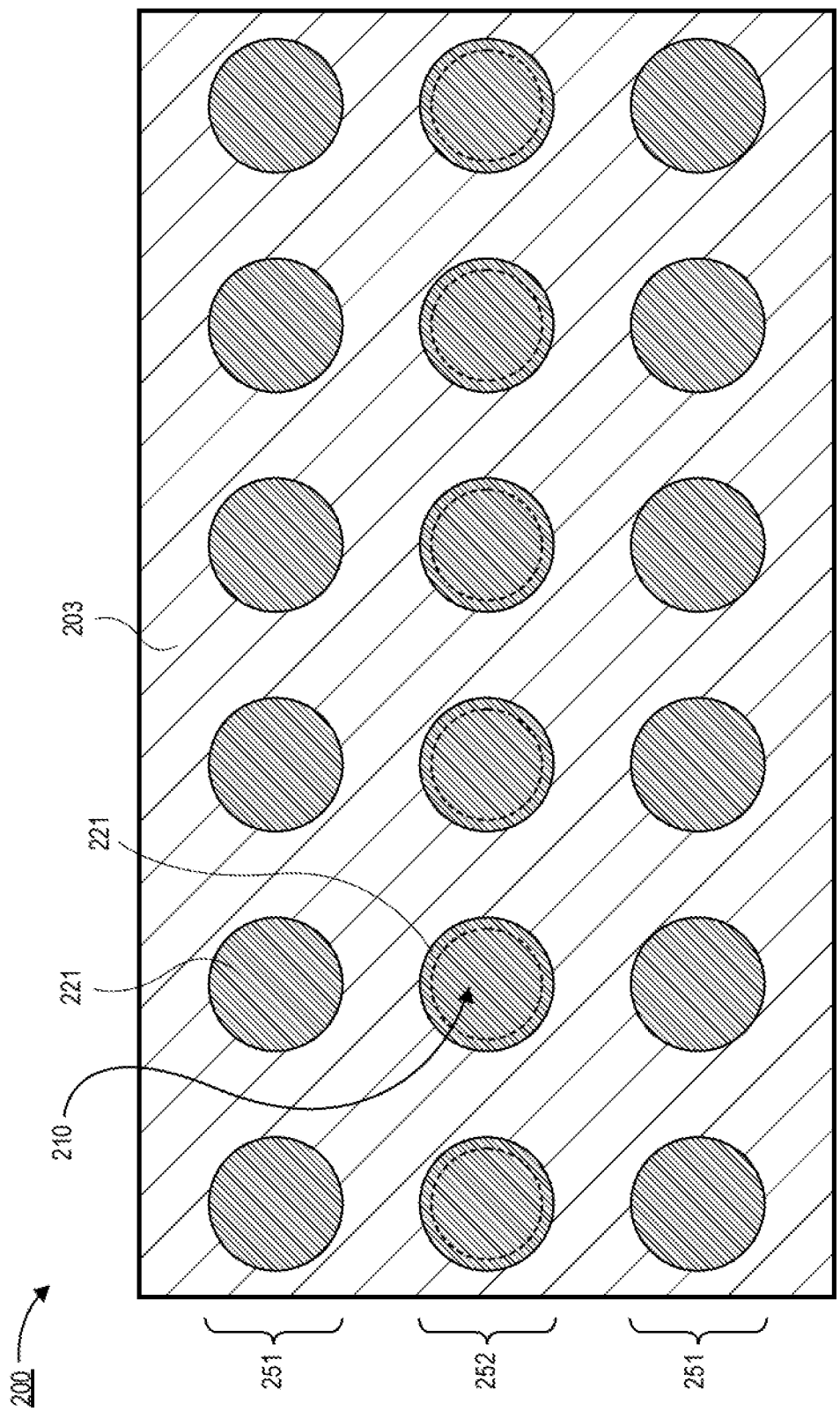
FIG. 2B is a plan view illustration of an electronic package that includes first pads and second pads, in accordance with an embodiment.

Referring now to FIG. 2B, a plan view illustration of a portion of an electronic package 200 is shown, in accordance with an embodiment. In an embodiment, the electronic package comprises a plurality of first pad structures 251 and a plurality of second pad structures 252 surrounded by an insulating layer 203. In an embodiment, the second pad structures 252 include dashed lines within the perimeter to indicate the presence of a void 210 below the first pads 221. As shown, the diameter of the void 210 is smaller than the diameter of the first pad 221. In other embodiments where the void 210 is filled with a dielectric foam (not shown), the diameter of the void 210 may be greater than a diameter of the first pad 221.

Referring now to FIGS. 3A-3I, a series of cross-sectional illustrations depicting a process for forming an electronic package 300 is shown, in accordance with an embodiment.

Figure 3A:
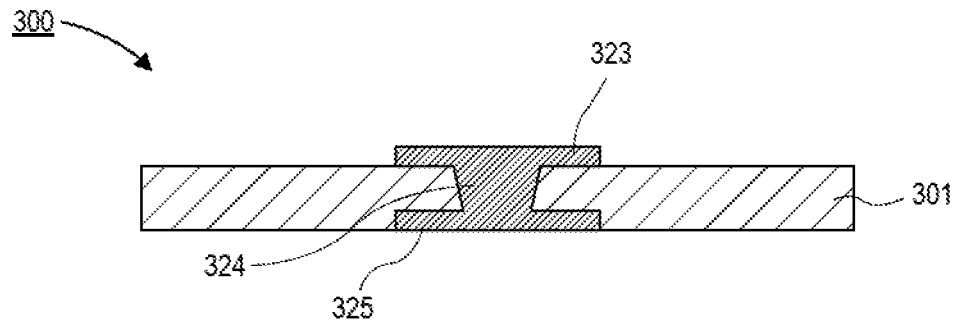
FIG. 3A is a cross-sectional illustration of a portion of an electronic package, in accordance with an embodiment.

Referring now to FIG. 3A, a cross-sectional illustration of a portion of an electronic package 300 is shown, in accordance with an embodiment. The illustration depicts a first buildup layer 301. It is to be appreciated that the first buildup layer 301 may be disposed over one or more underlying buildup layers (not shown) as is typical of package substrates. In an embodiment, the first buildup layer 301 may be an organic buildup layer. Conductive features may be embedded in the first buildup layer 301. For example, a first pad 325 and a first via 324 may be embedded in the first buildup layer 301. In an embodiment, a second pad 323 may be disposed over the first buildup layer 301 and connected to the first pad 325 by the first via 324.

Figure 3B:
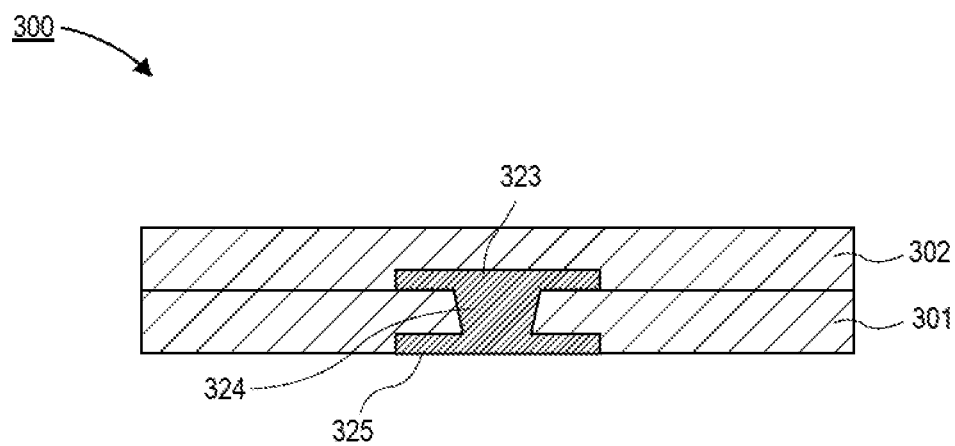
FIG. 3B is a cross-sectional illustration of the electronic package after a second buildup layer is disposed over a first buildup layer, in accordance with an embodiment.

Referring now to FIG. 3B, a cross-sectional illustration of the electronic package after a second buildup layer 302 is disposed over the first buildup layer 301 is shown, in accordance with an embodiment. In an embodiment, the second buildup layer 302 may be disposed over the first buildup layer 301 with a lamination process or the like. The second buildup layer 302 may be the same material as the first buildup layer 301. In other embodiments, the second buildup layer 302 is a different material than the first buildup layer 301. For example, the second buildup layer 302 may be a PID material.

Figure 3C:
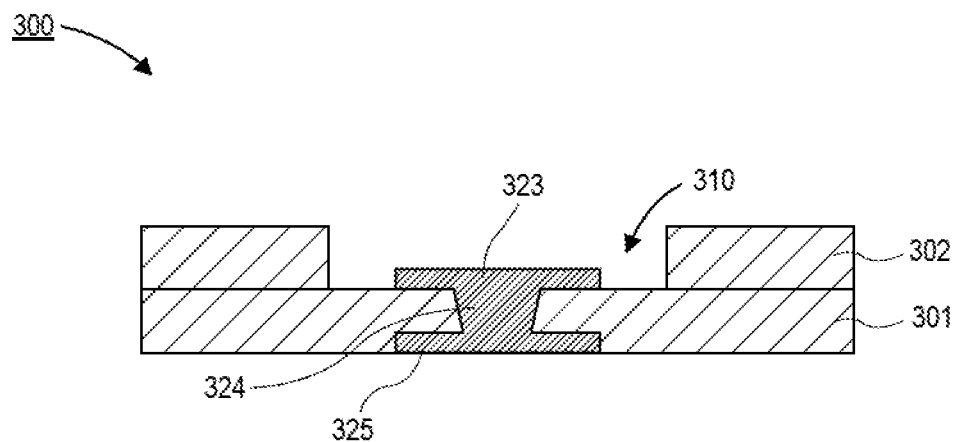
FIG. 3C is a cross-sectional illustration of the electronic package after a void is formed through the second buildup layer, in accordance with an embodiment.

Referring now to FIG. 3C, a cross-sectional illustration of the electronic package 300 after a void 310 is disposed into the second buildup layer 302 is shown, in accordance with an embodiment. In an embodiment, the void 310 may be formed with a lithographic patterning process. For example, when the second buildup layer 302 is a PID, the second buildup layer 302 may be selectively exposed and developed to form the void 310. Sidewalls of the void 310 may be substantially vertical in embodiments where a lithographic patterning process is used to form the void 310.

Figure 3D:
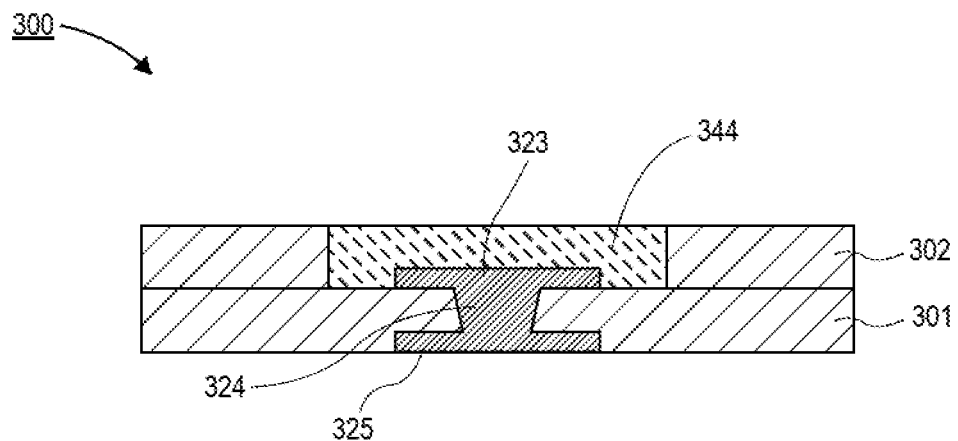
FIG. 3D is a cross-sectional illustration of the electronic package after a sacrificial layer is disposed in the void, in accordance with an embodiment.

Referring now to FIG. 3D, a cross-sectional illustration of the electronic package 300 after a sacrificial layer 344 is disposed in the void 310 is shown, in accordance with an embodiment. In an embodiment, the sacrificial layer 344 may be disposed with a dispensing or slit coating process. In an embodiment, the void 310 may be overfilled, and the overburden may be planarized so that a top surface of the sacrificial layer 344 is substantially coplanar with a top surface of the second buildup layer 302. The sacrificial layer 344 may be any suitable thermally decomposable material, such as a polycarbonate, polylactose, polybenzylcarbonate, and polypropylene polymer or the like.

Figure 3E:
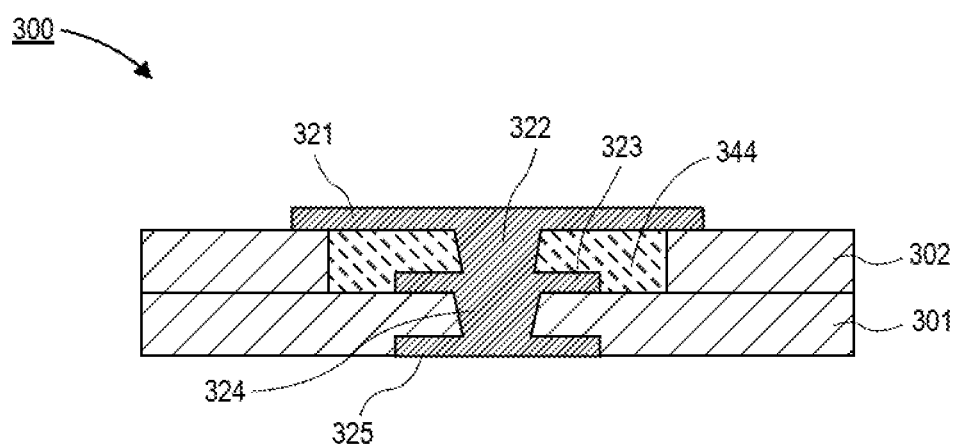
FIG. 3E is a cross-sectional illustration of the electronic package after a via is formed through the sacrificial layer and a pad is disposed over the sacrificial layer, in accordance with an embodiment.

Referring now to FIG. 3E, a cross-sectional illustration of the electronic package 300 after a second via 322 and a third pad 321 are formed is shown, in accordance with an embodiment. In an embodiment, the second via 322 and the third pad 321 may be formed with traditional processing methods (e.g., semi-additive processing (SAP)). For example, a via opening may be formed in the sacrificial layer 344 followed by a plating process. In an embodiment, the via opening is laser drilled, and therefore, provides a second via 322 with tapered sidewalls. In an embodiment, the third pad 321 may have a width that is greater than a width of the sacrificial layer 344. That is, the third pad 321 may be supported by a portion of the second buildup layer 302 and by the sacrificial layer 344.

In an embodiment, the third pad 321 may be a pad for any type of interconnect architecture. For example, the third pad 321 in FIG. 3E is a BGA pad. However, it is to be appreciated that electronic packages 300 may also include third pads 321 that are suitable for other interconnect architectures, such as sockets or other connectors.

Figure 3F:
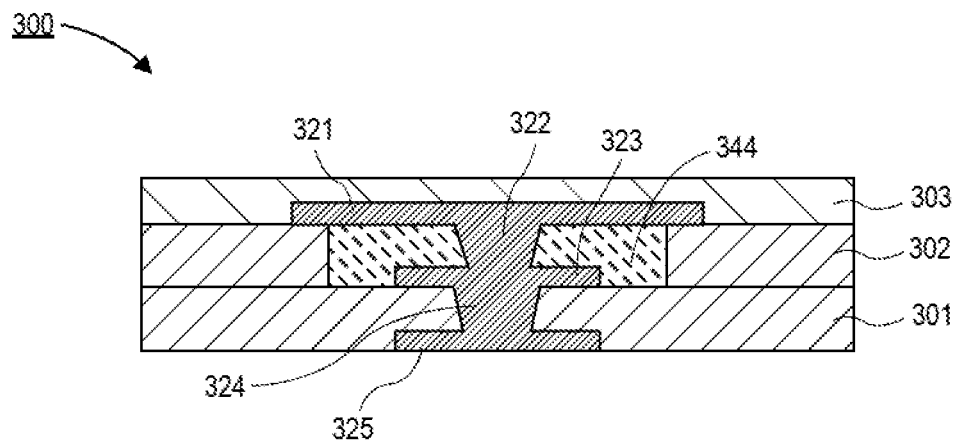
FIG. 3F is a cross-sectional illustration of the electronic package after an insulating layer is disposed over the pad, in accordance with an embodiment.

Referring now to FIG. 3F, a cross-sectional illustration of the electronic package 300 after an insulating layer 303 is disposed over the second buildup layer 302 and the third pad 321 is shown, in accordance with an embodiment. In an embodiment, the insulating layer 303 may be a solder resist layer or the like. The insulating layer 303 may be disposed with a lamination process or the like.

Figure 3G:
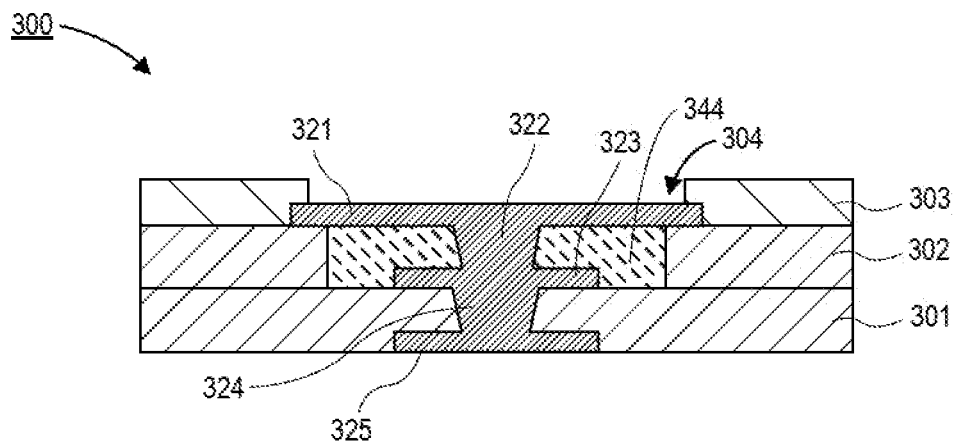
FIG. 3G is a cross-sectional illustration of the electronic package after an opening through the insulating layer is formed, in accordance with an embodiment.

Referring now to FIG. 3G, a cross-sectional illustration of the electronic package 300 after an opening 304 is formed through the insulating layer 303 is shown, in accordance with an embodiment. The opening 304 exposes a portion of the third pad 321. In an embodiment, a surface finish (not shown) may be applied to the exposed portions of the third pad 321. Embodiments may also include a curing operation to cure the insulating layer 303.

Figure 3H:
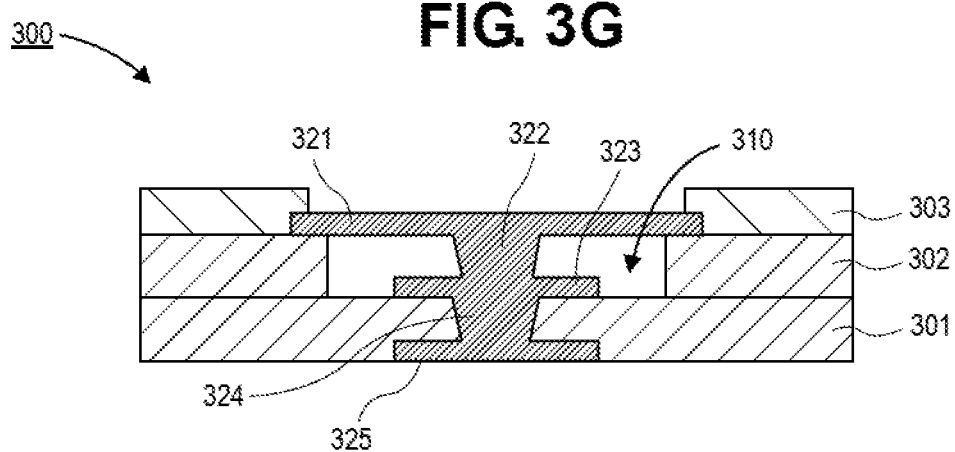
FIG. 3H is a cross-sectional illustration of the electronic package after the sacrificial layer is removed, in accordance with an embodiment.

Referring now to FIG. 3H, a cross-sectional illustration of the electronic package 300 after the sacrificial layer 344 is removed is shown, in accordance with an embodiment. In an embodiment, the sacrificial layer 344 is removed by thermal decomposition. At elevated temperatures, the sacrificial layer 344 vaporizes and the vapor escapes through the second buildup layer 302 and the insulating layer 303. The removal of the sacrificial layer 344 leaves behind an empty void 310. The void 310 may be defined by sidewalls of the second buildup layer 302, a surface of the first buildup layer 301, and the third pad 321. In an embodiment, the second via 322 and the second pad 323 may be within the void 310. The sacrificial layer 344 is shown as being entirely removed in FIG. 3H. However, it is to be appreciated that embodiments also include a partial removal of the sacrificial layer 344. That is, at least some portion of the sacrificial layer 344 may be present in the final structure in some embodiments.

Figure 3I:
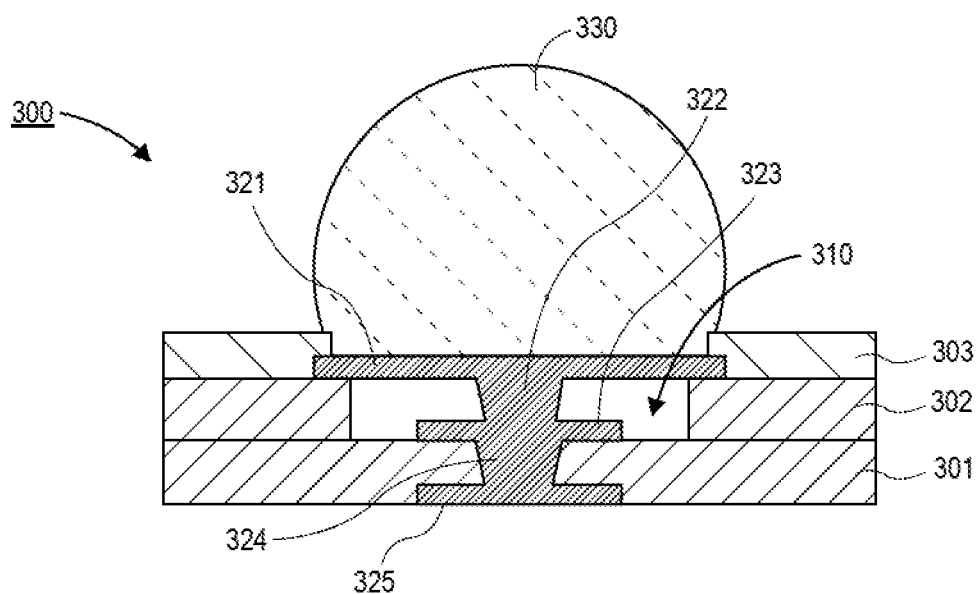
FIG. 3I is a cross-sectional illustration of the electronic package after a solder ball is disposed over the pad, in accordance with an embodiment.

Referring now to FIG. 3I, a cross-sectional illustration of the electronic package 300 after an interconnect 330 is attached to the third pad 321 is shown, in accordance with an embodiment. In an embodiment, the interconnect 330 may be a solder ball, such as a BGA ball. However, as noted above, it is to be appreciated that the interconnect 330 is not limited to solder balls, and other interconnect architectures may be coupled to the third pad 321.

Referring now to FIGS. 4A-4J, a series of cross-sectional illustrations depicting a process for forming an electronic package 400 is shown, in accordance with an embodiment.

Figure 4A:
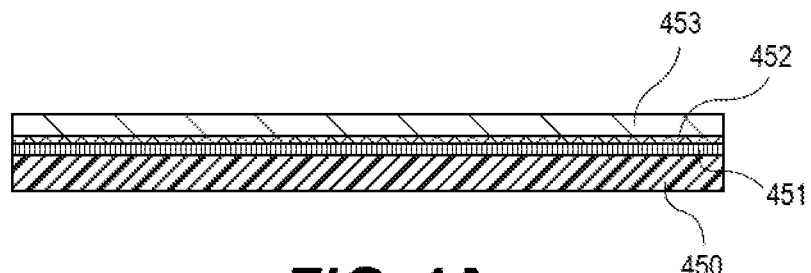
FIG. 4A is a cross-sectional illustration of a carrier, in accordance with an embodiment.

Referring now to FIG. 4A, a cross-sectional illustration of a carrier 450 is shown, in accordance with an embodiment. The carrier 450 may be a glass substrate, but it is to be appreciated that embodiments may include other substrates (e.g., silicon etc.) as the carrier 450. In an embodiment, a release layer 451 is disposed over a surface of the carrier 450. A seed layer 452 (e.g., a Ti/Cu seed layer) may be disposed over the release layer 451, and an insulating layer 453 may be disposed over the seed layer 452.

Figure 4B:
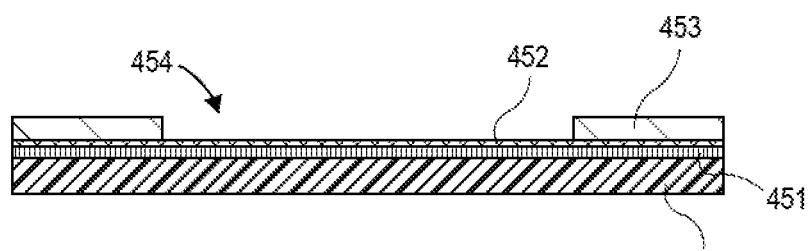
FIG. 4B is a cross-sectional illustration of the carrier after an opening through an insulating layer is formed, in accordance with an embodiment.

Referring now to FIG. 4B, a cross-sectional illustration of the carrier 450 after an opening 454 is formed in the insulating layer 453 is shown, in accordance with an embodiment. The opening 454 exposes a portion of the seed layer 452. The patterning may be implemented with typical lithographic patterning operations. In some embodiments, the insulating layer 453 is a PID and can be directly exposed and developed. In other embodiments, a resist layer may be used to pattern the insulating layer 453.

Figure 4C:
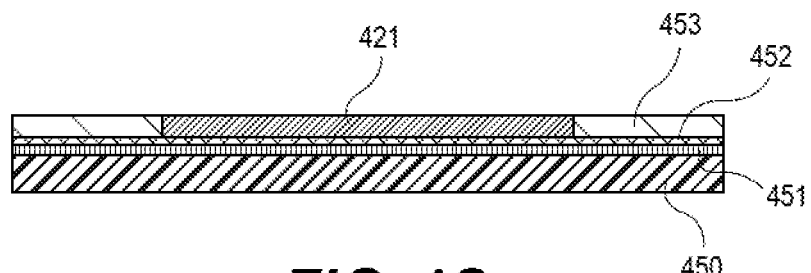
FIG. 4C is a cross-sectional illustrations of the carrier after a pad is formed in the opening, in accordance with an embodiment.

Referring now to FIG. 4C, a cross-sectional illustration of the carrier 450 after a first pad 421 is disposed over the seed layer 452 is shown, in accordance with an embodiment. The first pad 421 may be formed with any suitable deposition process. In a particular embodiment, the first pad 421 is formed with an electrolytic deposition process. The first pad 421 will be the pad onto which the interconnect (e.g., solder ball, etc.) is attached in the final structure. For example, the first pad 421 may be a BGA pad or the like. In the illustrated embodiment, the first pad 421 is shown as a single material layer. However, it is to be appreciated that embodiments may also include forming a surface finish (not shown) between the seed layer 452 and the first pad 421.

Figure 4D:
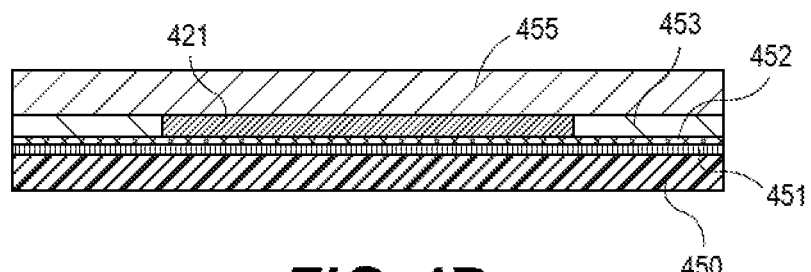
FIG. 4D is a cross-sectional illustration of the carrier after a dielectric layer is disposed over the pad, in accordance with an embodiment.

Referring now to FIG. 4D, a cross-sectional illustration of the carrier 450 after a dielectric layer 455 is disposed over the first pad 421 is shown, in accordance with an embodiment. In an embodiment, the dielectric layer 455 may be a dry film resist (DFR) or the like. The dielectric layer 455 may be laminated over the first pad 421.

Figure 4E:
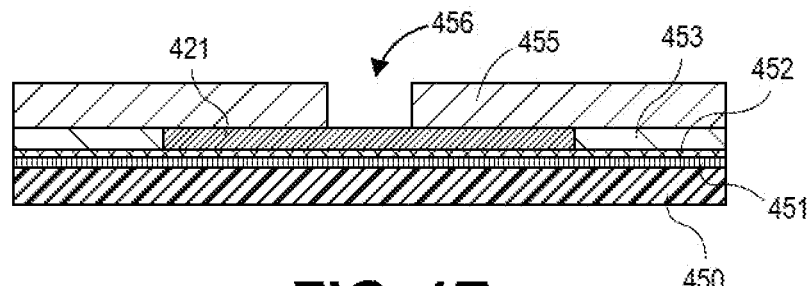
FIG. 4E is a cross-sectional illustration of the carrier after an opening is formed through the dielectric layer, in accordance with an embodiment.

Referring now to FIG. 4E, a cross-sectional illustration of the carrier 450 after an opening 456 is formed in the dielectric layer 455 is shown, in accordance with an embodiment. In an embodiment, the opening 456 may be lithographically patterned. As such, the sidewalls of the opening 456 may be substantially vertical.

Figure 4F:
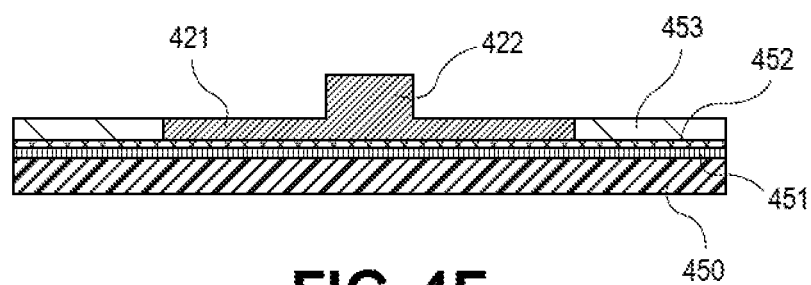
FIG. 4F is a cross-sectional illustration of the carrier after a via is formed and the dielectric layer is removed, in accordance with an embodiment.

Referring now to FIG. 4F, a cross-sectional illustration of the carrier 450 after a first via 422 is formed in the opening 456 and the dielectric layer 455 is removed is shown, in accordance with an embodiment. The first via 422 may be formed with a plating process. The first via 422 has sidewalls that conform to the shape of the opening 456. As such, the sidewalls of the first via 422 may be substantially vertical in some embodiments.

Figure 4G:
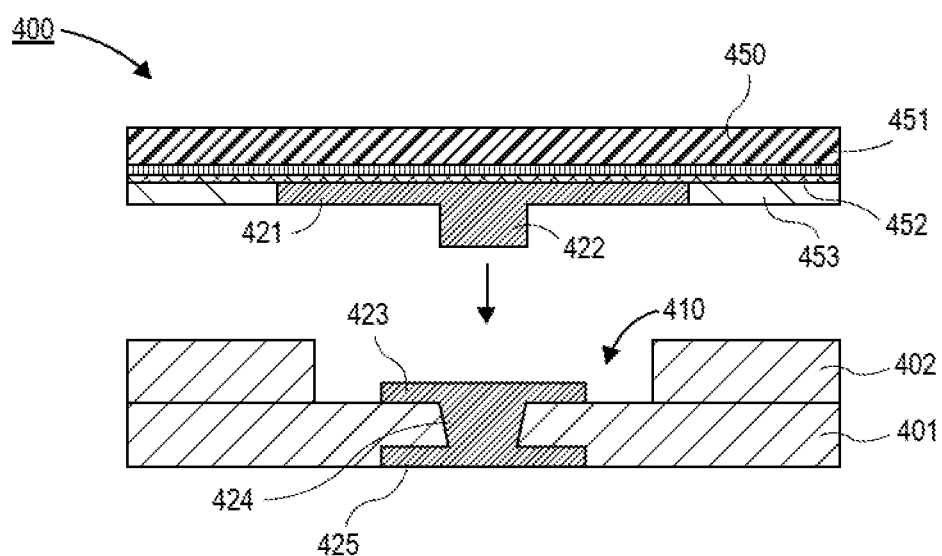
FIG. 4G is a cross-sectional illustration of the carrier being attached to an electronic package, in accordance with an embodiment.

Referring now to FIG. 4G, a cross-sectional illustration of the carrier 450 being attached to an electronic package 400 is shown, in accordance with an embodiment. In an embodiment, the electronic package 400 may comprise a first buildup layer 401, a second buildup layer 402, a second pad 423, a second via 424, and a third pad 425. A void 410 may be formed through the second buildup layer 402. The electronic package 400 in FIG. 4G may be substantially similar to (and formed with similar processes as) the electronic package 300 in FIG. 3C.

As indicated by the arrow, the carrier 450 is moved towards the electronic package 400 so that the first via 422 is brought into contact with the second pad 423. While a single first pad 421 and first via 422 is shown, it is to be appreciated that the carrier 450 may include a plurality of first pads 421 and first vias 422. Accordingly, the attachment process may be implemented at the panel level, wafer level, or any other large scale assembly process.

Figure 4H:
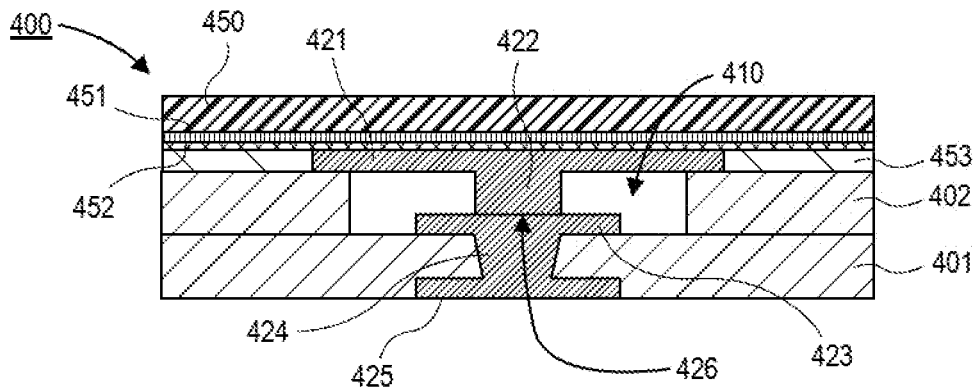
FIG. 4H is a cross-sectional illustration of the electronic package after the via is attached to a pad, in accordance with an embodiment.

Referring now to FIG. 4H, a cross-sectional illustration of the electronic package 400 after the first via 422 is bonded to the second pad 423 is shown, in accordance with an embodiment. In an embodiment, the first via 422 may be bonded to the second pad 423 with a fusion bonding process. For example, a copper-to-copper fusion bonding process may form a seam 426 at the interface between the first via 422 and the second pad 423. In an embodiment, fusion bonding may also be implemented between the first pad 421 and the second buildup layer 402 (e.g., copper-to-dielectric fusion bonding).

Figure 4I:
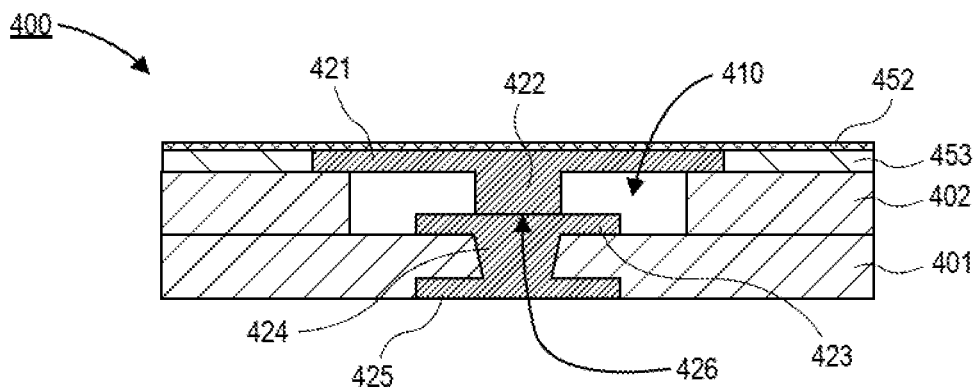
FIG. 4I is a cross-sectional illustration of the electronic package after the carrier is removed, in accordance with an embodiment.

Referring now to FIG. 4I, a cross-sectional illustration of the electronic package 400 after the carrier 450 is removed is shown, in accordance with an embodiment. In an embodiment, the carrier 450 may be removed by exposing the release layer with a laser (e.g., with a laser assisted release process). Other release mechanisms, like thermal lift-off, may also be used to remove the carrier 450 and the release layer 451 from the electronic package 400.

Figure 4J:
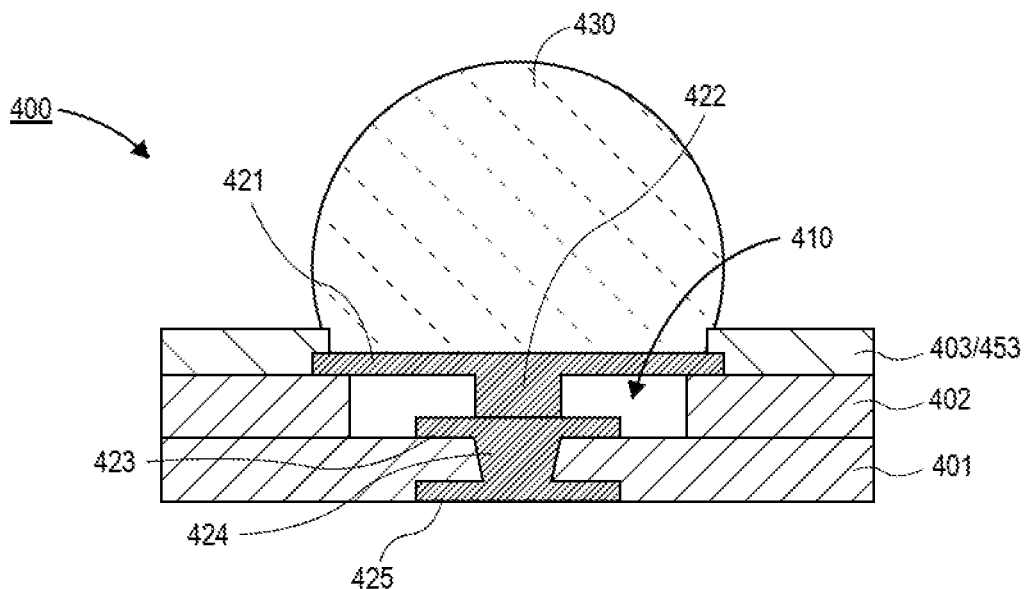
FIG. 4J is a cross-sectional illustration of the electronic package after a solder ball is attached to the pad, in accordance with an embodiment.

Referring now to FIG. 4J, a cross-sectional illustration of the electronic package 400 after an interconnect 430 is attached to the first pad 421 is shown, in accordance with an embodiment. In an embodiment, prior to attaching the interconnect 430, the exposed portions of the seed layer 452 may be removed and a second insulating layer 403 may be disposed over the first insulating layer 453 and over portions of the first pad 421. For example, the second insulating layer 403 may be a solder resist or the like. In an embodiment, the interconnect 430 may be a solder ball, such as a BGA ball. However, as noted above, it is to be appreciated that the interconnect 430 is not limited to solder balls, and other interconnect architectures may be coupled to the first pad 421.

Referring now to FIGS. 5A-5E, a series of cross-sectional illustrations depicting a process for forming an electronic package is shown, in accordance with an additional embodiment.

Figure 5A:
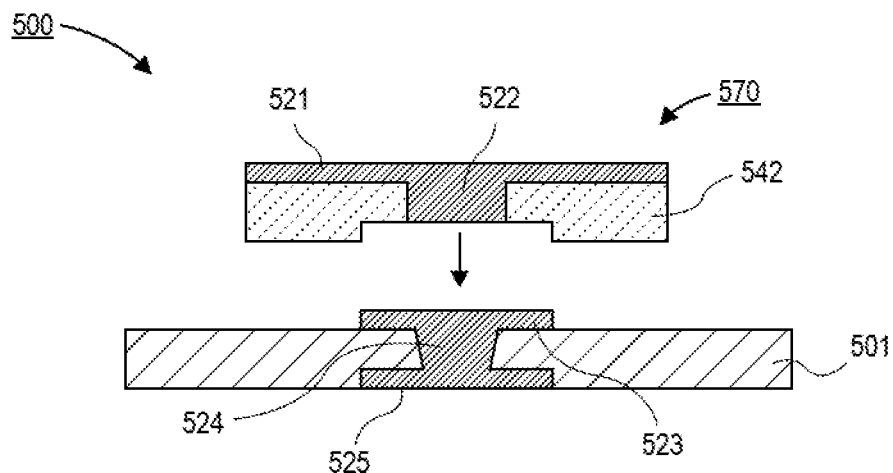
FIG. 5A is a cross-sectional illustration of an electronic package with a via-pad structure with a dielectric foam being attached to the electronic package, in accordance with an embodiment.

Referring now to FIG. 5A, a cross-sectional illustration of an electronic package 500 is shown, in accordance with an embodiment. In an embodiment, the electronic package comprises a first buildup layer 501. The first buildup layer 501 may be disposed over underlying buildup layers (not shown). A second pad 523, a second via 524, and a third pad 525 may be embedded in or over the first buildup layer 501.

In an embodiment, a pre-fabricated structure 570 may be attached to the electronic package 500. The pre-fabricated structure 570 may comprise a first pad 521 and a first via 522. In an embodiment, a dielectric foam 542 may be over a surface of the first pad 521 and surround the first via 522. In an embodiment, the pre-fabricated structure 570 may be attached to the electronic package 500 with a pick-and-place process (as indicated by the arrow). In other embodiments, a plurality of pre-fabricated structures 570 may be attached substantially in parallel with a wafer level or panel level attachment process.

In an embodiment, the dielectric foam 542 may be any suitable dielectric material with a relatively high volume percentage of voids (i.e., air-gaps). For example, the dielectric foam 542 may be a polyurethane foam or the like. The dielectric constant of the dielectric foam 542 may depend on the volume percentage of air in the foam. As the volume percentage of air increases, the dielectric constant approaches 1 and the dielectric loss tangent decreases. In a particular embodiment, the dielectric constant of the dielectric foam 542 is approximately 2 or less, approximately 1.5 or less, approximately 1.2 or less, or approximately 1.1 or less.

Figure 5B:
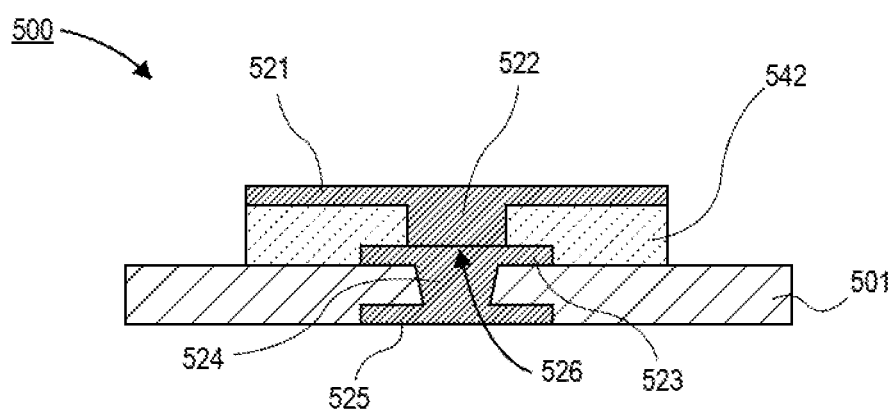
FIG. 5B is a cross-sectional illustration of the electronic package after the via is attached to the pad of the electronic package, in accordance with an embodiment.

Referring now to FIG. 5B, a cross-sectional illustration of the electronic package 500 after the first via 522 is bonded to the second pad 523 is shown, in accordance with an embodiment. In an embodiment, the first via 522 may be bonded to the second pad 523 with a fusion bonding process. For example, a copper-to-copper fusion bonding process may form a seam 526 at the interface between the first via 522 and the second pad 523. As shown, the dielectric foam 542 surrounds the top and sidewall surfaces of the second pad 523 in some embodiments.

Figure 5C:
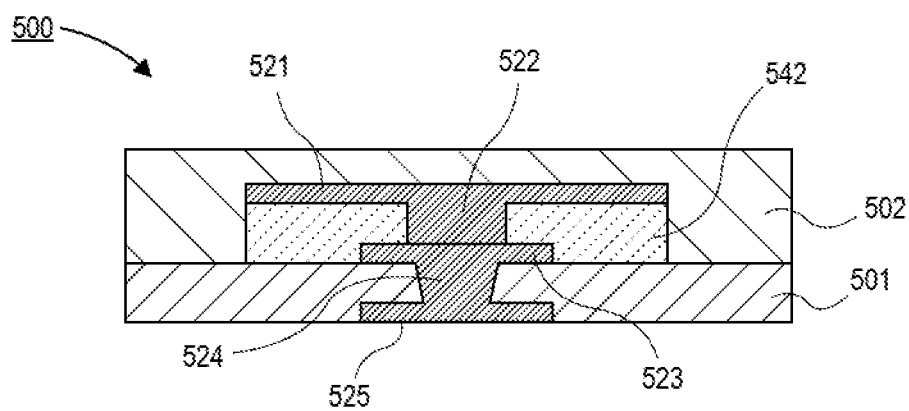
FIG. 5C is a cross-sectional illustration of the electronic package after an insulating layer is disposed over the electronic package, in accordance with an embodiment.

Referring now to FIG. 5C, a cross-sectional illustration of the electronic package 500 after an insulating layer 502 is disposed over the first buildup layer 501 is shown, in accordance with an embodiment. In an embodiment, the insulating layer 502 may be laminated over the pre-fabricated structure 570 and the first buildup layer 501. In an embodiment, the insulating layer 502 may be a solder resist.

Figure 5D:
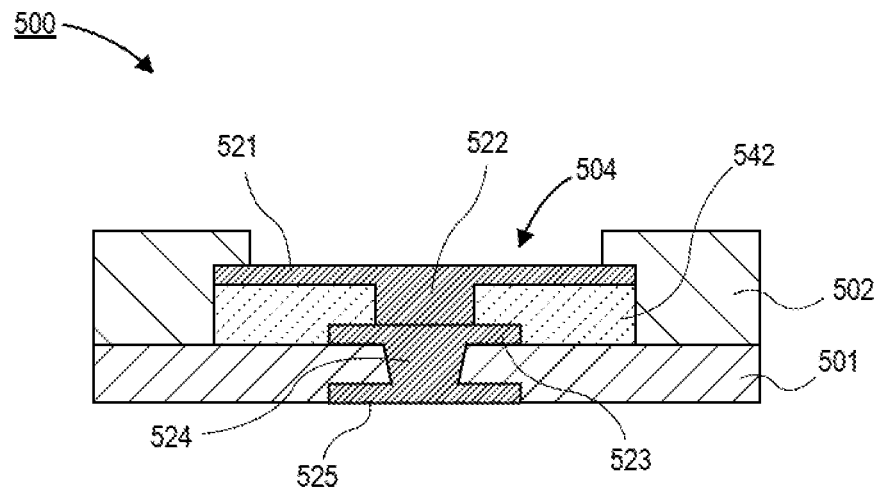
FIG. 5D is a cross-sectional illustration of the electronic package after an opening through the insulating layer is formed, in accordance with an embodiment.

Referring now to FIG. 5D, a cross-sectional illustration of the electronic package 500 after an opening 504 is formed through the insulating layer 502 is shown, in accordance with an embodiment. The opening 504 may expose a portion of the first pad 521. In an embodiment, a surface finish (not shown) may be applied to the exposed portion of the first pad 521.

Figure 5E:
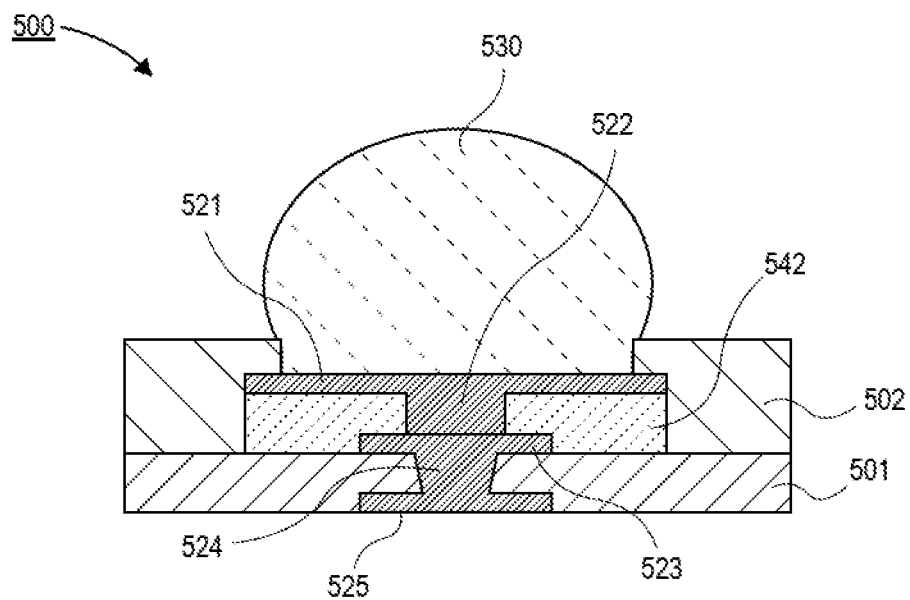
FIG. 5E is a cross-sectional illustration of the electronic package after a solder ball is attached to the pad, in accordance with an embodiment.

Referring now to FIG. 5E, a cross-sectional illustration of the electronic package 500 after an interconnect 530 is attached to the first pad 521 is shown, in accordance with an embodiment. In an embodiment, the interconnect 530 may be a solder ball, such as a BGA ball. However, as noted above, it is to be appreciated that the interconnect 530 is not limited to solder balls, and other interconnect architectures may be coupled to the first pad 521.

Figure 6:
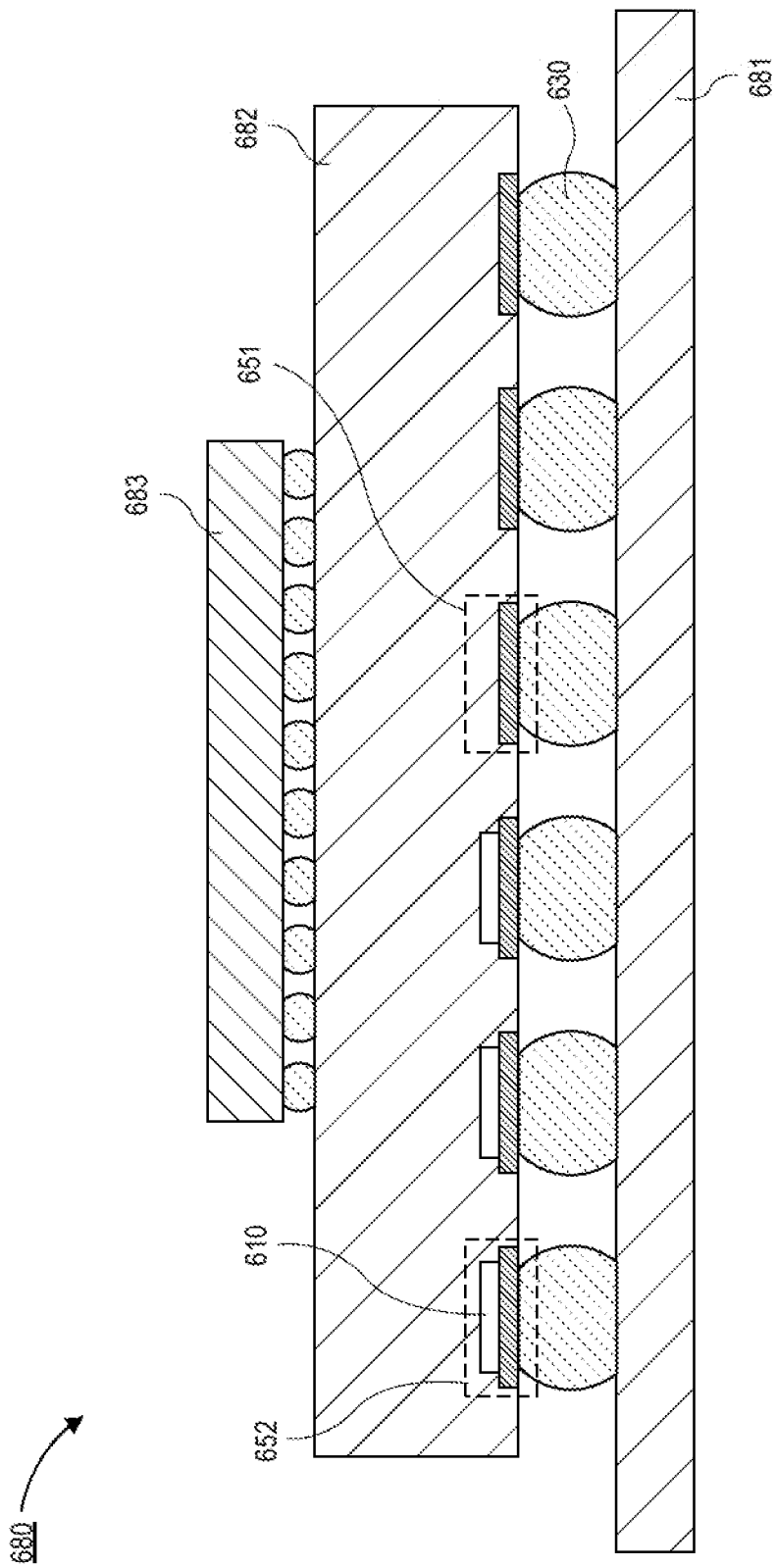
FIG. 6 is a cross-sectional illustration of an electronic system that includes BGA pads with dielectric voids, in accordance with an embodiment.

Referring now to FIG. 6, a cross-sectional illustration of an electronic system 680 is shown, in accordance with an embodiment. In an embodiment, the electronic system 680 comprises a board 681, a package substrate 682, and a die 683. In an embodiment, the board 681 is electrically coupled to the package substrate 682 by interconnects 630. The interconnects 630 may be attached to first pad structures 651 and second pad structures 652 of the package substrate 682. In an embodiment, the second pad structures 652 are particularly suitable for high speed signaling. For example, the second pad structures 652 include voids 610 that may be air filled or filled with a dielectric foam (not shown). Accordingly, the capacitance of the second pad structures 652 is lowered (due to a dielectric constant of 1 (i.e., the dielectric constant of air) or close to 1 (i.e., the dielectric constant of a dielectric foam)). This allows for better impedance matching and reduces reflections and improves efficiency.

In an embodiment, the board 681 may be any suitable substrate, such as a printed circuit board (PCB) or the like. In the illustrated embodiment, the interconnects 630 are shown as solder balls (e.g., BGA balls). However, it is to be appreciated that the interconnects 630 may also be sockets or other connectors. In an embodiment, a single die 683 is shown. However, it is to be appreciated that the electronic system 680 may include any number of dies 683. In some embodiments, interposers, bridges, or the like may electrically couple two or more dies 683 together.

Figure 7:
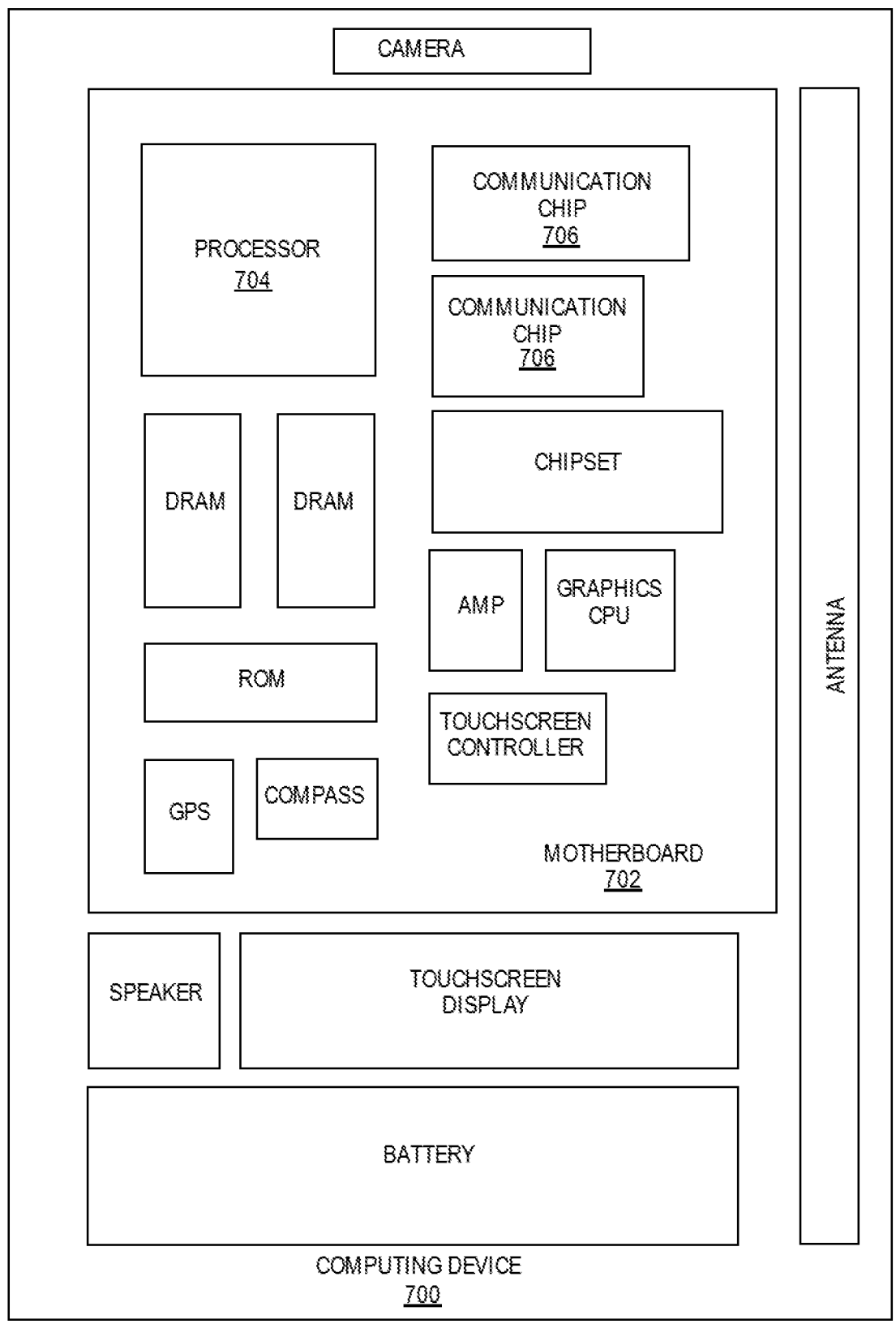
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be part of an electronic package that comprises a pad structure with a void, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be part of an electronic package that comprises a pad structure with a void, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a first buildup layer; a second buildup layer over the first buildup layer; a void through the second buildup layer; and a first pad over the second buildup layer, wherein the first pad covers the void.

Example 2: the electronic package of Example 1, further comprising: a second pad over the first buildup layer, wherein the second pad is within the void; and a via electrically coupling the first pad to the second pad.

Example 3: the electronic package of Example 2, wherein the via has a sidewall profile that is tapered.

Example 4: the electronic package of Example 2, wherein the via has a sidewall profile that is substantially vertical.

Example 5: the electronic package of Example 4, further comprising: a seam at an interface between the via and the second pad.

Example 6: the electronic package of Examples 1-5, wherein a width of the first pad is greater than a width of the void.

Example 7: the electronic package of Examples 1-6, wherein the first pad seals the void and forms an air gap cavity within the electronic package.

Example 8: the electronic package of Examples 1-7, wherein the void is filled with a dielectric foam.

Example 9: the electronic package of Example 8, wherein a width of the void is greater than a width of the first pad.

Example 10: the electronic package of Examples 1-9, wherein the first buildup layer is different than the second buildup layer.

Example 11: the electronic package of Example 10, wherein the second buildup layer is a photo-imageable dielectric (PID).

Example 12: an electronic package, comprising: a package substrate; a plurality of pads in an array over a surface of the package substrate, wherein the plurality of pads comprise: first pads; and second pads, wherein a void in the package substrate is positioned below each of the second pads.

Example 13: the electronic package of Example 12, wherein the plurality of pads are ball grid array (BGA) pads.

Example 14: the electronic package of Example 13, wherein the second pads are high-speed signaling pads.

Example 15: the electronic package of Example 14, wherein the second pads are serializer-deserializer (SerDes) pads or peripheral component interconnect express (PCIe) pads.

Example 16: the electronic package of Examples 12-15, wherein the void below each of the second pads is an air-filled cavity.

Example 17: the electronic package of Examples 12-15, wherein the void below each of the second pads is filled with a dielectric foam.

Example 18: the electronic package of Examples 12-17, further comprising: a solder ball on each of the plurality of pads.

Example 19: the electronic package of Example 18, further comprising: a board, wherein the package substrate is coupled to the board by the solder balls.

Example 20: a method of forming an electronic package, comprising: forming a void in a buildup layer; filling the void with a sacrificial material; forming a pad over the sacrificial material, wherein a portion of the pad is supported by the buildup layer; and removing the sacrificial material.

Example 21: the method of Example 20, wherein the sacrificial material is a thermally decomposable material, and wherein removing the sacrificial material comprises a heat treatment.

Example 22: the method of Example 20 or Example 21, further comprising: forming a via through the sacrificial material prior to forming the pad, wherein the via has a sidewall profile that is tapered.

Example 23: a method of forming an electronic package, comprising: forming a void through a first buildup layer, wherein the void exposes a first pad on a surface of a second buildup layer; and positioning a second pad over the void, wherein the second pad is electrically coupled to the first pad by a via, and wherein a seam characteristic of fusion bonding is located between the first pad and the via.

Example 24: the method of Example 23, wherein a dielectric foam surrounds the via and supports a bottom surface of the second pad.

Example 25: the method of Example 23 or Example 24, wherein a sidewall profile of the via is substantially vertical.

What is claimed is:
1. An electronic package, comprising:
a first buildup layer;
a second buildup layer over the first buildup layer;
a void through the second buildup layer;
a first pad over the second buildup layer, wherein the first pad covers the void;
a via beneath and coupled to the first pad; and
a second pad over the first buildup layer, wherein the second pad is within the void, the via electrically coupling the first pad to the second pad, wherein the void comprises an air-gap that laterally surrounds the via and the second pad, and wherein the air-gap exposes sides of the via and the second pad.

2. The electronic package of claim 1, wherein the via has a sidewall profile that is tapered.

3. The electronic package of claim 1, wherein the via has a sidewall profile that is substantially vertical.

4. The electronic package of claim 1, further comprising: a seam at an interface between the via and the second pad.

5. The electronic package of claim 1, wherein a width of the first pad is greater than a width of the void.

6. The electronic package of claim 1, wherein the first pad seals the void.

7. The electronic package of claim 1, wherein a width of the void is greater than a width of the first pad.

8. The electronic package of claim 1, wherein the first buildup layer is different than the second buildup layer.

9. The electronic package of claim 8, wherein the second buildup layer is a photo-imageable dielectric (PID).

10. An electronic package, comprising:
a package substrate;
a plurality of pads in an array over a surface of the package substrate, wherein the plurality of pads comprise:
first pads;
second pads, wherein a void in the package substrate is positioned below each of the second pads; and
a plurality of vias, wherein individual ones of the plurality of vias are beneath and coupled to a corresponding one of the second pads and are above and coupled to a corresponding one of the first pads, wherein corresponding ones of the voids each comprise an air-gap that laterally surrounds a corresponding one of the plurality of vias and a corresponding one of the first pads, and wherein the air-gap exposes sides of the corresponding one of the plurality of vias and the corresponding one of the first pads.

11. The electronic package of claim 10, wherein the plurality of pads are ball grid array (BGA) pads.

12. The electronic package of claim 11, wherein the second pads are high-speed signaling pads.

13. The electronic package of claim 12, wherein the second pads are serializer-deserializer (SerDes) pads or peripheral component interconnect express (PCIe) pads.

14. The electronic package of claim 10, further comprising:
a solder ball on each of the plurality of pads.

15. The electronic package of claim 14, further comprising:
a board, wherein the package substrate is coupled to the board by the solder balls.

16. A method of forming an electronic package, comprising:
forming a void in a buildup layer;
filling the void with a sacrificial material;
forming a pad over the sacrificial material, wherein a portion of the pad is supported by the buildup layer;
removing the sacrificial material;
forming a second buildup layer over the buildup layer;
forming the void through the second buildup layer;
forming a first pad over the second buildup layer, wherein the first pad covers the void;
forming a via beneath and coupled to the first pad;
and forming a second pad over the buildup layer, wherein the second pad is within the void, the via electrically coupling the first pad to the second pad, wherein the void comprises an air-gap that laterally surrounds the via and the second pad, and wherein the air-gap exposes sides of the via and the second pad.

17. The method of claim 16, wherein the sacrificial material is a thermally decomposable material, and wherein removing the sacrificial material comprises a heat treatment.

18. The method of claim 16, further comprising:
forming a via through the sacrificial material prior to forming the pad, wherein the via has a sidewall profile that is tapered.

19. A method of forming an electronic package, comprising:
forming a void through a first buildup layer,
wherein the void exposes a first pad on a surface of a second buildup layer;
positioning a second pad over the void,
wherein the second pad is electrically coupled to the first pad by a via, and
wherein a seam characteristic of fusion bonding is located between the first pad and the via;
forming the second buildup layer over the buildup layer;
forming the void through the second buildup layer;
forming the first pad over the second buildup layer,
wherein the first pad covers the void;
forming the via beneath and coupled to the first pad;
and forming the second pad over the buildup layer, wherein the void comprises an air-gap that laterally surrounds the via and the second pad, and wherein the air-gap exposes sides of the via and the second pad.

20. The method of claim 19, wherein a dielectric foam surrounds the via and supports a bottom surface of the second pad.

21. The method of claim 19, wherein a sidewall profile of the via is substantially vertical.

* * * * *